(12) United States Patent
Ziadeh et al.

(10) Patent No.: US 12,130,482 B2
(45) Date of Patent: Oct. 29, 2024

(54) HYDROPHOBIC FEATURE TO CONTROL ADHESIVE FLOW

(71) Applicant: Intel Corporation, Santa Clara, CA (US)

(72) Inventors: Bassam Ziadeh, Gilbert, AZ (US); Jingyi Huang, Chandler, AZ (US); Yiqun Bai, Chandler, AZ (US); Ziyin Lin, Chandler, AZ (US); Vipul Mehta, Chandler, AZ (US); Joseph Van Nausdle, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 17/132,851

(22) Filed: Dec. 23, 2020

(65) Prior Publication Data
US 2022/0196937 A1    Jun. 23, 2022

(51) Int. Cl.
*G02B 6/42* (2006.01)

(52) U.S. Cl.
CPC ......... *G02B 6/4239* (2013.01); *G02B 6/4212* (2013.01); *G02B 6/423* (2013.01); *G02B 6/426* (2013.01)

(58) Field of Classification Search
CPC .... G02B 6/4239; G02B 6/4212; G02B 6/423; G02B 6/426; H01L 21/563; H01L 24/16; H01L 24/32; H01L 24/73; H01L 24/92; H01L 2224/16227; H01L 2224/26145; H01L 2224/26175; H01L 2224/32225; H01L 2224/73204; H01L 2224/92125; H01L 2924/10157; H01L 23/295; H01L 23/3185; H01L 23/552
See application file for complete search history.

(56) References Cited

U.S. PATENT DOCUMENTS

| 11,094,682 B2* | 8/2021 | Islam ................. H01L 23/3107 |
| 2009/0032974 A1* | 2/2009 | Farooq ................. H01L 21/563 |
| | | 257/E21.59 |

(Continued)

OTHER PUBLICATIONS

Search Report from European Patent Application No. 21198864.7, mailed Mar. 21, 2022, 10 pgs.

(Continued)

*Primary Examiner* — John Bedtelyon
(74) *Attorney, Agent, or Firm* — Schwabe, Williamson & Wyatt P.C.

(57) ABSTRACT

Embodiments described herein may be related to apparatuses, processes, and techniques related to hydrophobic features to block or slow the spread of epoxy. These hydrophobic features are placed either on a die surface or on a substrate surface to control epoxy spread between the die in the substrate to prevent formation of fillets. Packages with these hydrophobic features may include a substrate, a die with a first side and a second side opposite the first side, the second side of the die physically coupled with a surface of the substrate, and a hydrophobic feature coupled with the second side of the die or the surface of the substrate to reduce a flow of epoxy on the substrate or die. In embodiments, these hydrophobic features may include a chemical barrier or a laser ablated area on the substrate or die. Other embodiments may be described and/or claimed.

19 Claims, 12 Drawing Sheets

(56) References Cited

U.S. PATENT DOCUMENTS

2011/0042797 A1 2/2011 Park
2014/0061902 A1 3/2014 Ramalingam

OTHER PUBLICATIONS

Yang Chengjuan et al: "Fabrication of controllable wettability of crystalline silicon surfaces by laser surface texturing and silanization", Applied Surface Science, Elsevier, Amsterdam, NL, vol. 497, Aug. 27, 2019 (Aug. 27, 2019), XP085832463, ISSN: 0169-4332, DOI:10.1016/J.APSUSC.2019.143805 [retrieved on Aug. 27, 2019].

* cited by examiner

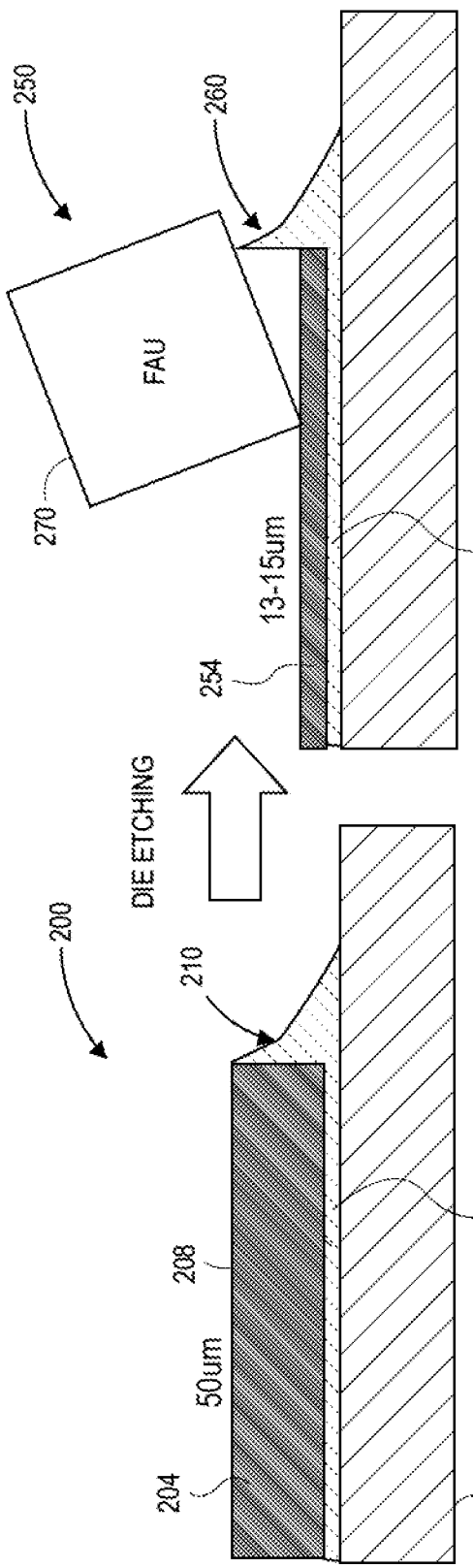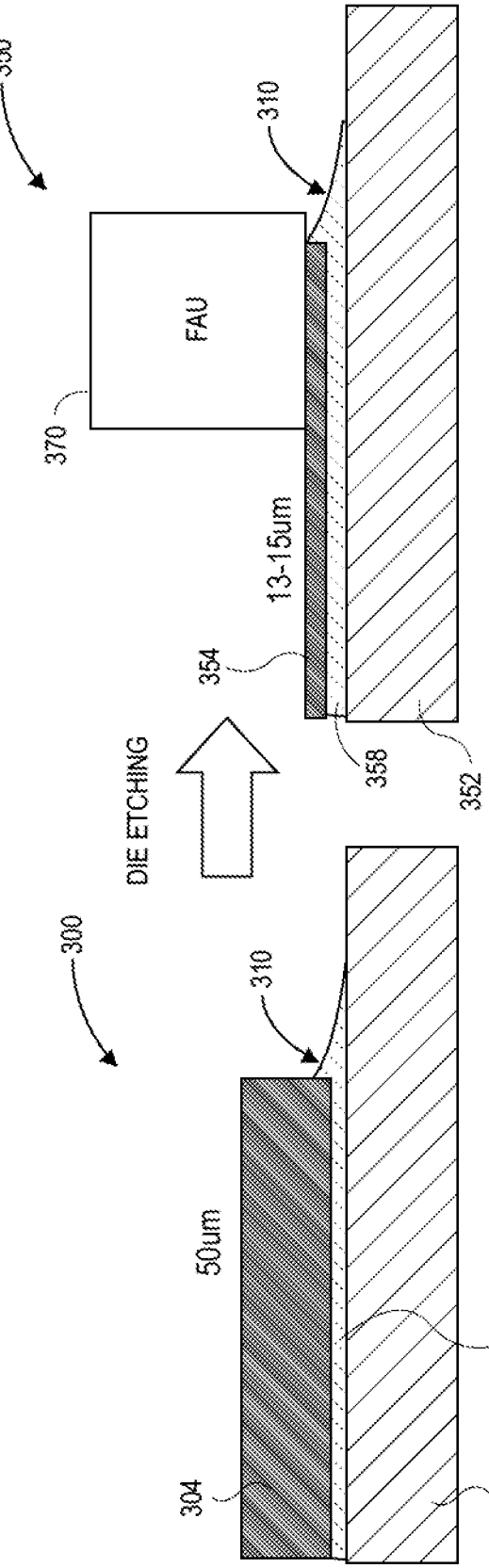

HYDROPHOBIC FEATURE TO CONTROL ADHESIVE FLOW

FIELD

Embodiments of the present disclosure generally relate to the field of semiconductor packaging, and in particular to adhesive flow during component coupling.

BACKGROUND

Continued growth in virtual machines and cloud computing will increase the demand for reliable manufactured semiconductor packages, including optical packages.

BRIEF DESCRIPTION OF THE DRAWINGS

FIG. 2 illustrates a legacy implementation of a post die etch epoxy fillet when coupling a second die.

FIG. 3 illustrates a post die etch epoxy fillet created with a hydrophobic barrier, in accordance with various embodiments.

DETAILED DESCRIPTION

Figure 1:
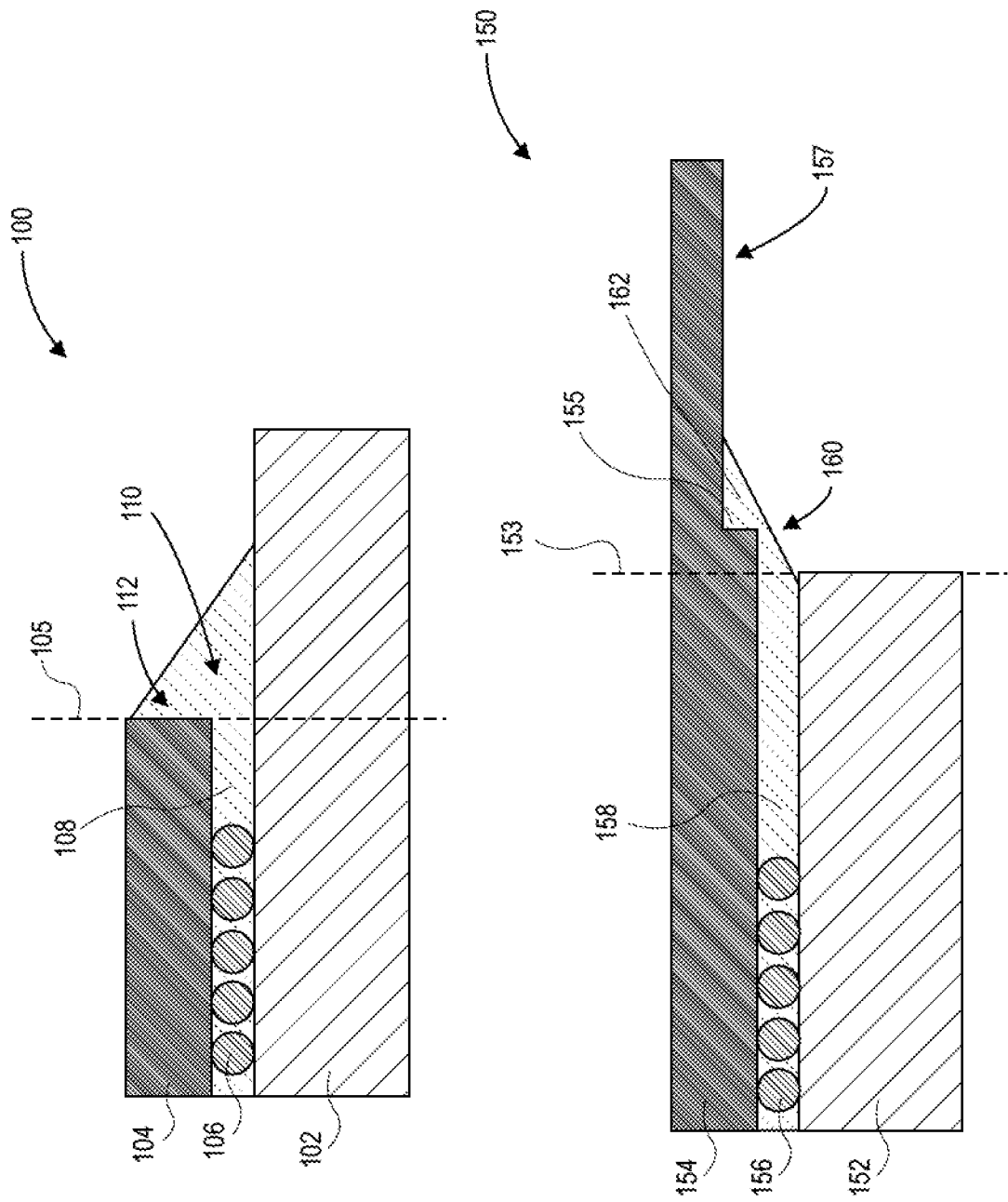
FIG. 1 illustrates two example types of epoxy fillets formed when attaching a die to a substrate using legacy underfilling techniques.

Embodiments described herein may be related to apparatuses, processes, systems, and techniques for reducing the area of epoxy underfill that spreads during optical package assembly. Excessive spread of epoxy underfill may result in, for example, fillets that may appear on a side of a die. These fillets may be formed by a bead of epoxy that is drawn up the side or over a face of a die. Although small size fillets may increase the surface area of the bond and provide structural adhesive and bracing for a die, large size fillets may physically interfere with optical fiber array handling and block optical signal coupling.

For example, for a topside optical chip process, if an epoxy fillet covers a silicon sidewall it will interfere with a fiber handle array release that may be part of an optical coupler or connector. For side optical chip process that uses a V-groove structure for to attach optical fibers, in particular glass optical fibers, if the epoxy forms a fillet or bleeds to the fiber attach location, the epoxy will interfere with or block the light path of the optical fibers. Other problems occur, as discussed below, when components such as a fiber attach unit (FAU) is designed to couple to and overhang a top of a die where a surface of the FAU is unable to completely physically couple with a surface of the die. Therefore, achieving minimum or even zero epoxy fillet along critical die edges become very important for photonics applications.

In embodiments, hydrophobic features may be used to block or slow the spread of epoxy. These hydrophobic features may be placed either on a die surface, or on a substrate surface to control epoxy spread with respect to specific areas or regions between the die and the substrate. Embodiments of packages with these hydrophobic features may include a substrate, a die with a first side and a second side opposite the first side, the second side of the die physically coupled with a surface of the substrate, and a hydrophobic feature coupled with the second side of the die or the surface of the substrate to reduce a flow of epoxy on the substrate or die. In embodiments, these hydrophobic features may be used under a die shadow area, either on a substrate side or a die side.

In embodiments, the hydrophobic features, by slowing the flow of the epoxy, will reduce or eliminate fillet formation on sides of the die, or on the undersides of a die if the die is an overhanging die. A hydrophobic feature may be formed using a chemical barrier or a laser ablation barrier, however other hydrophobic chemicals, materials, or structures may also be used to form the epoxy barrier. In embodiments, these hydrophobic features may also be used to slow the flow of adhesives in general, which may include epoxy material or resin material.

In legacy implementations, capillary underfill (CUF) materials may be optimized based on the semiconductor packaging requirements to reduce wetting. In addition, parameters for epoxy dispensing during the manufacturing process may be altered or optimized for packaging requirements. In addition, physical trenches may be placed on the substrate to stop epoxy spreading. However, each of these legacy implementations are not able to meet tolerance requirements that may be required for optical package assembly. For example, physical trenches may only be applied to a substrate, with a typical width of around 200 µm, and these physical trenches are unable to be applied to a die side surface. In some legacy implementations, problems with fillet formation may be addressed by not using any epoxy or adhesive at all. However, this legacy approach may result in a physically weaker package without the epoxy or adhesive, where components are more likely to separate from the package and result in poor package performance.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates two example types of epoxy fillets formed when attaching a die to a substrate using legacy underfilling techniques. Legacy package 100 includes a substrate 102 that is physically and electrically coupled with a die 104 using a ball grid array (BGA) 106. During the legacy package 100 production process, an epoxy 108 is applied between the substrate 102 and the die 104, to provide additional strength in the physical coupling of the substrate 102 and the die 104. In addition, the epoxy 108 may provide electrical protection for the BGA 106.

With the legacy epoxy flow process, the epoxy 108 will flow past an edge 105 of the die 104 and flow into region 110. In addition, due in part to capillary action and surface energy, some of the epoxy 108 will travel up the edge of the die 104 and form a fillet 112. If, later in the manufacturing process, the die 104 has to be etched down, this fillet 112 of epoxy will remain and may be higher than the etched height of the die 104 and cause die stacking problems, particularly if legacy package 100 is an optical package. This is discussed further below with respect to FIG. 2. It should be noted that legacy package 100 shows epoxy 108 flow into region 110 at just one side of the die 104. However, in legacy implementations, the epoxy 108, will spread to all four sides of the die 104.

Legacy package 150 shows another example of fillet formation. Similarly to legacy package 100, there is a substrate 152 that is electrically and physically coupled to die 154 using a ball grid away 156. An epoxy 158 has been flowed between the substrate 152 and the die 154. As shown, the die 154 includes V-grooves on the underside of the die 154 to which optical fibers are to optically couple to the die 154.

During legacy manufacturing, epoxy 158 may flow past an edge 153 of the substrate 152 and flow into region 160 and travel upwards. Depending upon the characteristics and viscosity of the epoxy 158, during the flow, the epoxy 158 may flow into region 162, and form a horizontal fillet. Note that this fillet 162 will block fibers from lying cleanly into the V-grooves 157, and may also completely or partially block any optical inputs 155 into the die 154.

In legacy implementations, the epoxy regions 110 and fillet 112 of legacy package 100, and epoxy regions 160 and fillet 162 of legacy package 150 may vary in shape, slope, and consistency based upon the type of epoxy or adhesive used, the ambient temperature of the process, and/or orientation of the package during the epoxy flow process. It should be appreciated that in these legacy implementations of package 100 and package 150, extra actions need to be taken to clear the resulting fillets 162, 112 prior to release from manufacturing. This will add additional time and cost to the manufacturing process of a photonics package, as well as a decrease in quality and/or robustness of the resulting package due to the required cleaning process. In addition, the cleaning process to remove fillets 162, 112 may introduce chemical or physical stress to the substrate 102, 152 and/or die 104, 154, which may further compromise the operational quality of the resulting package.

FIG. 2 illustrates a legacy implementation of a post die etch epoxy fillet when coupling a second die. Legacy package 200 includes a substrate 202, a die 204, and epoxy 208, which may be similar to substrate 102, die 104, and epoxy 108 of package 100 of FIG. 1. As a result of the epoxy flow process, a fillet 210 has formed on the side of the die 204. As shown, the die 204 has a height of 50 µm. Legacy package 200 shows a point in manufacturing before the die 204 has been etched.

Legacy package 250 shows the die 254, which may be similar to die 204, after it has been etched to a height of between 13 to 15 µm. After this etching, the fillet 260 now extends above the height of the etched die 254. At this point, a FAU 270 is to be attached to a top surface of the etched die 254. In embodiments, the FAU 270 may be optically and/or electrically coupled with the etched die 254. As shown, the positioning of the FAU 270 is to overhang the etched die 254; however, this is not possible because the height of the fillet 260 is above the top of the etched die 254. Thus, to properly attach the FAU 270, an additional action in the manufacturing process will necessarily include removing or shortening the fillet 260, which may be similar to fillet 210, at least to the point where it is flush with the top of the etched die 254. In other legacy implementations, instead of the FAU 270 being coupled with the etched die 254, there may be some other component, such as a silicon active or passive die to be coupled with the top and to overhang etched die 254.

FIG. 3 illustrates a post die etch epoxy fillet created with a hydrophobic barrier, in accordance with various embodiments. Package 300 shows the result of implementing one or more hydrophobic features when manufacturing the package 300. Package 300 includes a substrate 302, die 304, and epoxy 308 which may be similar to substrate 202, die 204 and epoxy 208 of FIG. 2. Prior to the flow of the epoxy 308, hydrophobic features as discussed further below may be applied to a surface of the die 304 closest to the surface of the substrate 302, or on a surface of substrate 302 that is closest to a surface of the die 304. As discussed further below, these hydrophobic features, which may include a chemical barrier or a laser ablation, may fall within a shadow area of the die 304.

After the flow of the epoxy 308, in embodiments a fillet 310 may form at a side of the die 304. Due to the hydrophobic features placed on either the die 304 or the substrate 302, the height of the fillet 310 will be substantially lower than the height of a legacy fillet, for example legacy fillet 210 of FIG. 2.

Package 350 shows the die 354, which may be similar to die 304, after it has been etched to a height of between 13 to 15 µm. After this etching, the fillet 310 is still below the height of the etched die 354. At this point, a FAU 370, which may be similar to FAU 270 of FIG. 2, may be attached to a top surface of the etched die 354. In embodiments, the FAU 370 may be optically and/or electrically coupled with the etched die 354, and a positioning of the FAU 370 is to overhang the etched die 354. In other legacy implementations, instead of the FAU 370 to couple with the etched die 354, there may be some other component, such as a silicon active or passive die to be coupled with the top and overhang etched die 354. Thus, with the packages 300, 350 of FIG. 3, no additional manufacturing actions are needed to modify the fillet 310, decreasing time and cost of manufacture, and increasing the quality of the resulting package.

Figure 4:
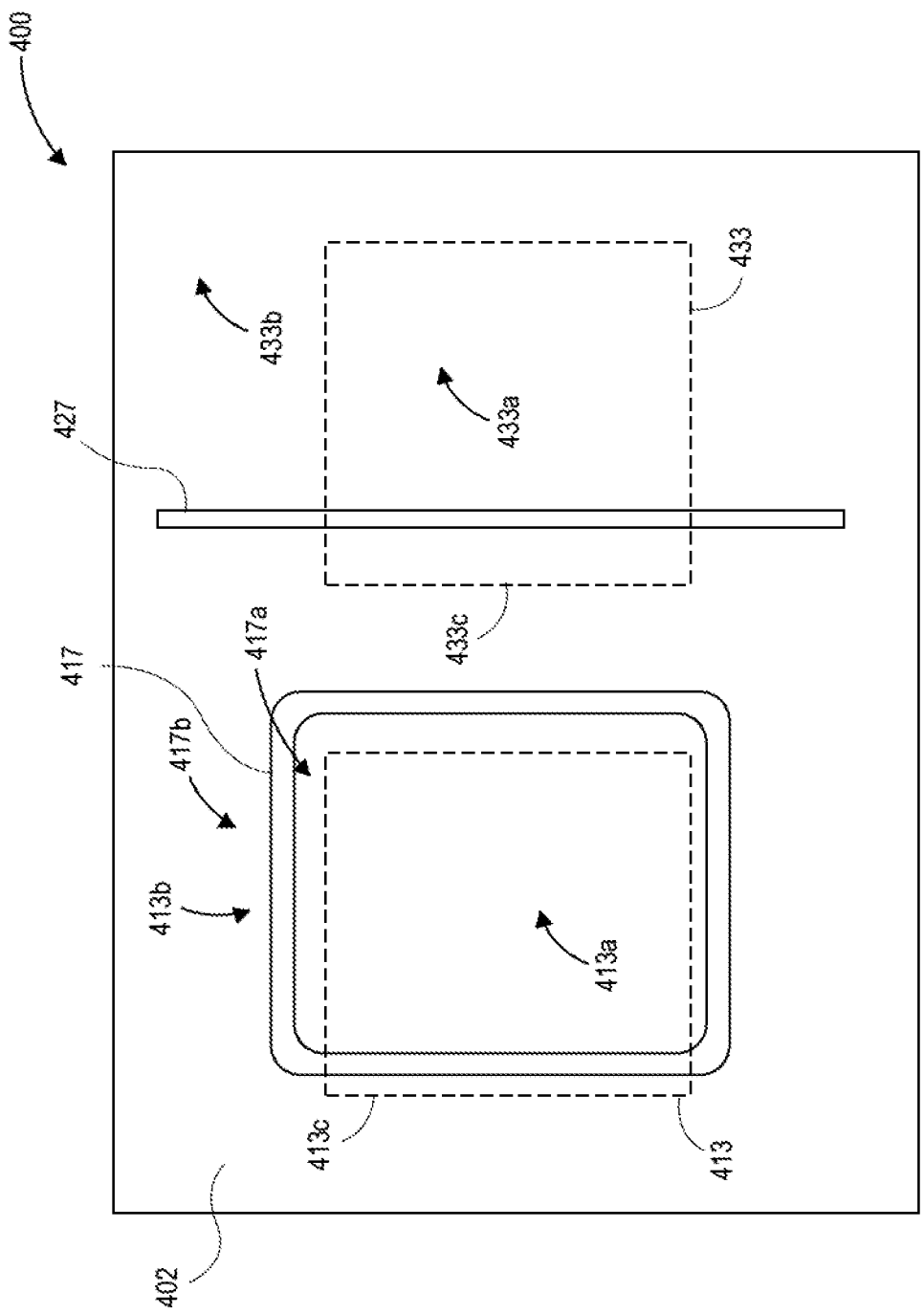
FIG. 4 illustrates a substrate with two die shadows that show examples of applying a hydrophobic feature that is a chemical barrier, in accordance with various embodiments.

FIG. 4 illustrates a substrate with two die shadows that show examples of applying a hydrophobic feature that is a chemical barrier, in accordance with various embodiments. Package 400 includes a substrate 402, which may be similar to substrate 302 of FIG. 3. Die shadows 413, 433 are shown on the substrate, with their respective dies not shown. In embodiments, a die shadow 413, 433 may be an X-Y footprint of what a die, which may be similar to die 304 of FIG. 3, would make on a substrate 402 after the die (not shown) is attached to the substrate 402. In embodiments, the die shadow may include the area that a BGA, for example BGA 106 of FIG. 1, may occupy.

Chemical barrier 417 may be disposed on substrate 402 partially within the die shadow 413*a* and partially outside the die shadow 413*b*. The chemical barrier 417 may be positioned to minimize a fillet, such as fillet 310 of FIG. 3, that may form at or near the edge 413*c* of a die shadow 413 when the die is in place. During epoxy flow, the epoxy, such as epoxy 310 of FIG. 3, may be flowed into area 413*a*. When the epoxy encounters the chemical barrier 417, the epoxy may significantly slow or stop progress beyond the chemical barrier.

In embodiments, the chemical barrier 417 may be a material with a high thixotropic index. In embodiments, the chemical barrier 417 may be applied to the substrate 402 using a nozzle, or may be applied using a template that may be placed upon substrate 402, on which chemical barrier 417 may be applied. As shown, chemical barrier 417 may form a loop with an internal region 417*a* and an external region 417*b*. During epoxy flow, the epoxy may be inserted into the internal region 417*a* and flow toward die shadow edge 413*c* where it is significantly slowed or stopped.

In another embodiment, chemical barrier 427 may be disposed upon substrate 402, and partially divide shadow area 433. As shown, epoxy may be deposited in region 433*a*, and flow toward shadow die edge 433*c*, where it will be slowed down or stopped by chemical barrier 427. As a result, there will be minimum to no epoxy fillet proximate to shadow die edge 433*c* when the die is inserted.

Figure 5:
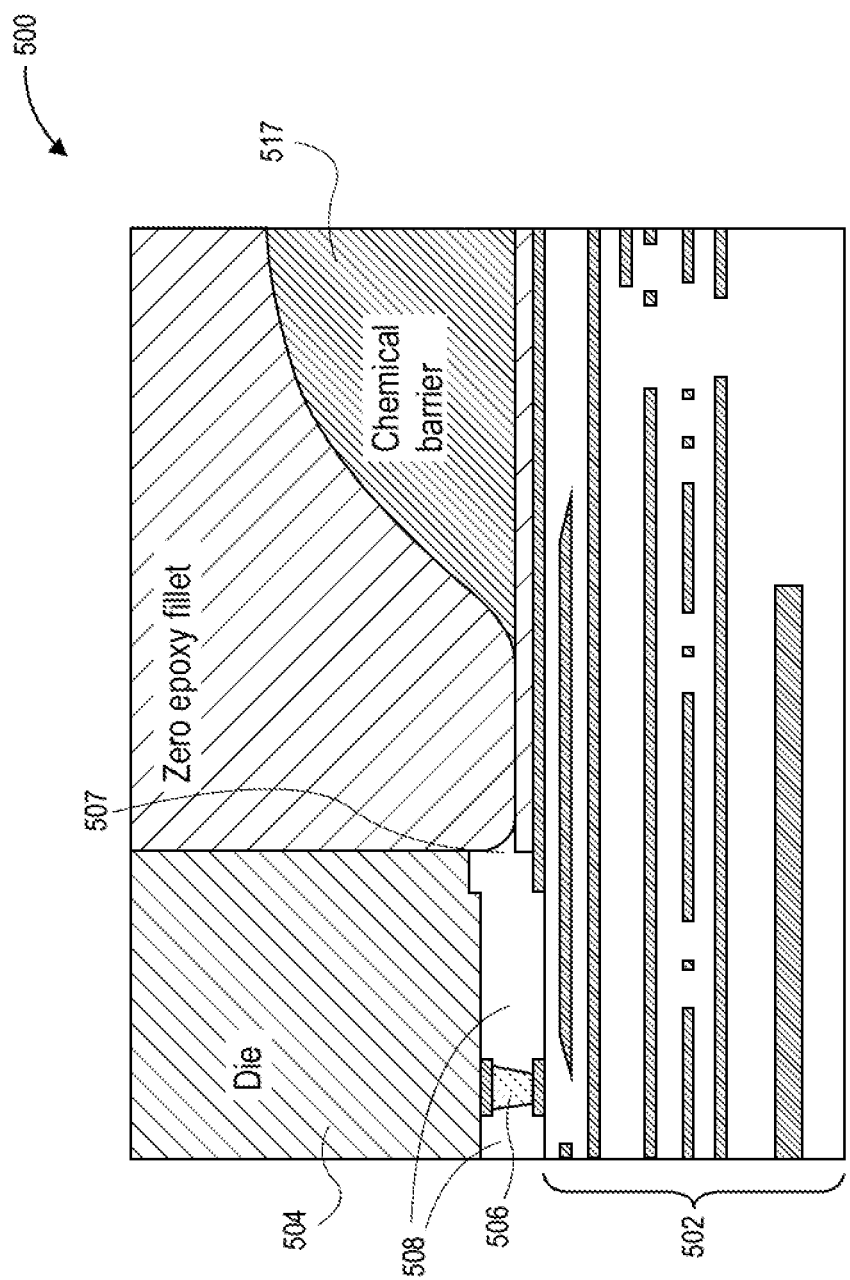
FIG. 5 illustrates a cross-section of a package that includes a die, a zero epoxy fillet, and a chemical barrier, in accordance with various embodiments.

FIG. 5 illustrates a cross-section of a package that includes a die, a zero epoxy fillet, and a chemical barrier, in accordance with various embodiments. Package 500 is a cross-section that includes a die 504, which may be similar to die 304 of FIG. 3. The die 504 is electrically coupled through a BGA 506 to substrate 502, which may be similar to substrate 302 of FIG. 3. Prior to epoxy flow, the chemical barrier 517, which may be similar to chemical barrier 417 or 427 of FIG. 4, was placed on the substrate 502.

The chemical barrier 517 in this embodiment has a small width, less than 150 µm. As a result, the chemical barrier 517 may fit in the open space at the die or substrate surface. The resulting epoxy fillet 507 at the lower right corner of die 504 is a result of the chemical barrier 517 effectively stopping epoxy 508 from spreading.

Figure 6:
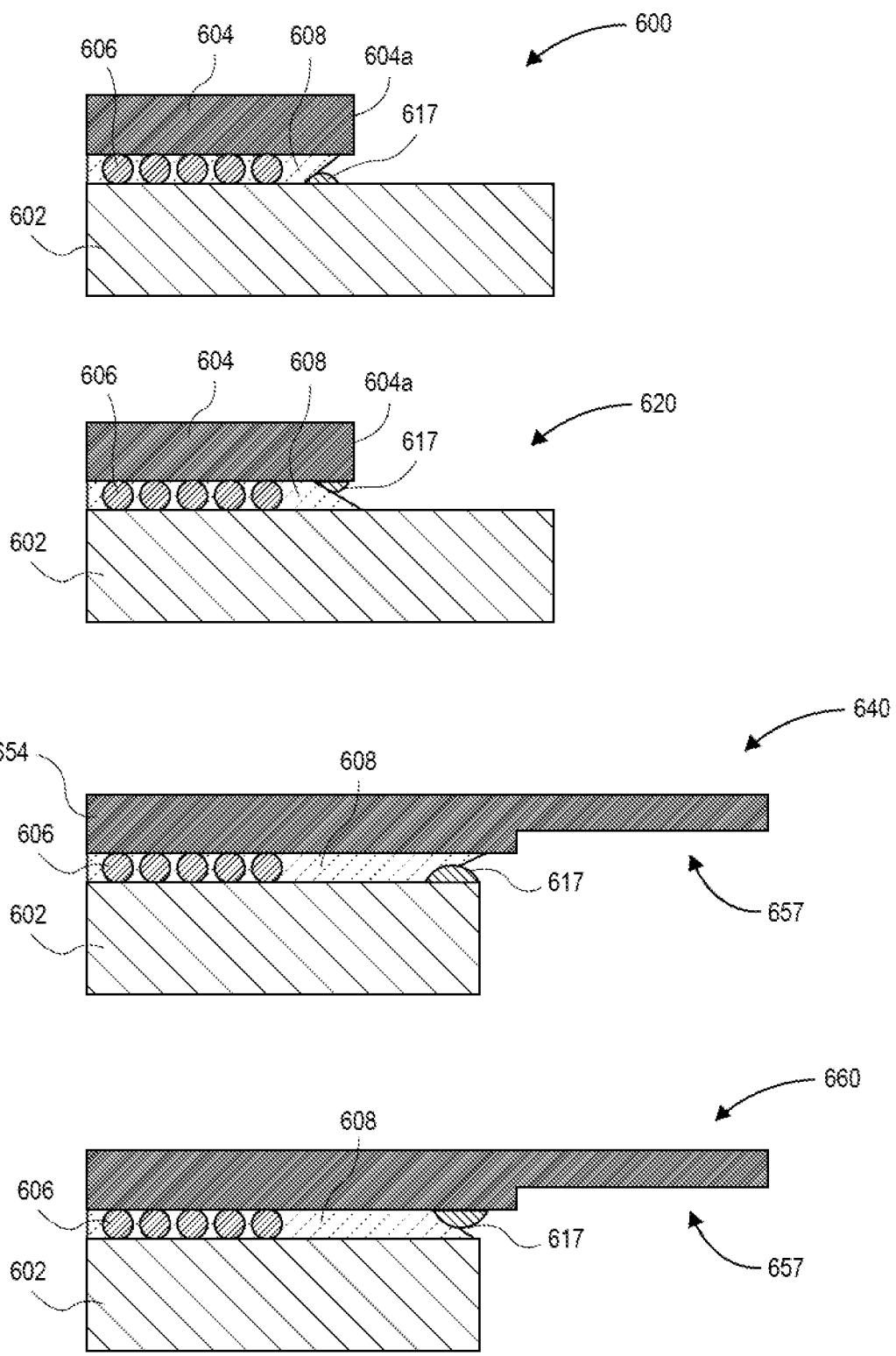
FIG. 6 illustrates various stages in a process for implementing a hydrophobic chemical barrier, in accordance with various embodiments.

FIG. 6 illustrates various stages in a process for implementing a hydrophobic chemical barrier, in accordance with various embodiments. Package 600 shows die 604 that is electrically and physically coupled with substrate 602 using BGA 606. In this embodiment, hydrophobic chemical barrier 617 is placed on the substrate 602 within the die shadow of die 604. When epoxy 608 is flowed, the hydrophobic chemical barrier 617 slows the flow, so that the epoxy 608 does not flow beyond the edge of the die 604*a*. In this example, no epoxy fillet is formed. In embodiments, package 600 may show a technique for applying a chemical barrier on a substrate for a top attach process.

Package 620 shows another embodiment, with die 604 that is electrically and physically coupled with substrate 602 using BGA 606. In this embodiment, hydrophobic chemical barrier 617 is applied to a bottom surface of the die 604. When epoxy 608 is flowed hydrophobic chemical barrier 617 blocks the flow so it does not flow to the edge of the die 604*a*. In this example, no epoxy fillet is formed. As a result, for package 600 and package 620, a FAU, such as FAU 370 of FIG. 3, may be positioned directly on top of and overhanging the die 604, after the die 604 has been etched, without being misaligned by an epoxy fillet, such as epoxy fillet 112 of FIG. 1. In embodiments, package 620 may show a technique for applying a chemical barrier on a die 604 side for a top attach process Package 640 shows another embodiment, with die 654, which may be similar to die 154 of FIG. 1, that is electrically and physically coupled with substrate 602 using BGA 606. Hydrophobic chemical barrier 617 is placed at the top of the substrate 602, to block the flow of epoxy 608 from flowing underneath the V-groove 657 section of the die 654. This way, optical fibers (not shown) that couple with the V-groove 657 may cleanly optically couple with die 654. In embodiments, package 640 may show a technique for applying a chemical barrier on a substrate 602 for a side attach process.

Package 660 shows another embodiment, with die 654 that is electrically and physically coupled with substrate 602 using BGA 606. Hydrophobic chemical barrier 617 is disposed at a bottom of the die 654 to prevent or slow down epoxy 608 from flowing underneath the V-groove area 657. This way, optical fibers (not shown) that couple with the V-groove 657 may cleanly optically couple with die 654. In embodiments, package 660 may show a technique for applying a chemical barrier on a die 604 side for a side attach process.

Figure 7:
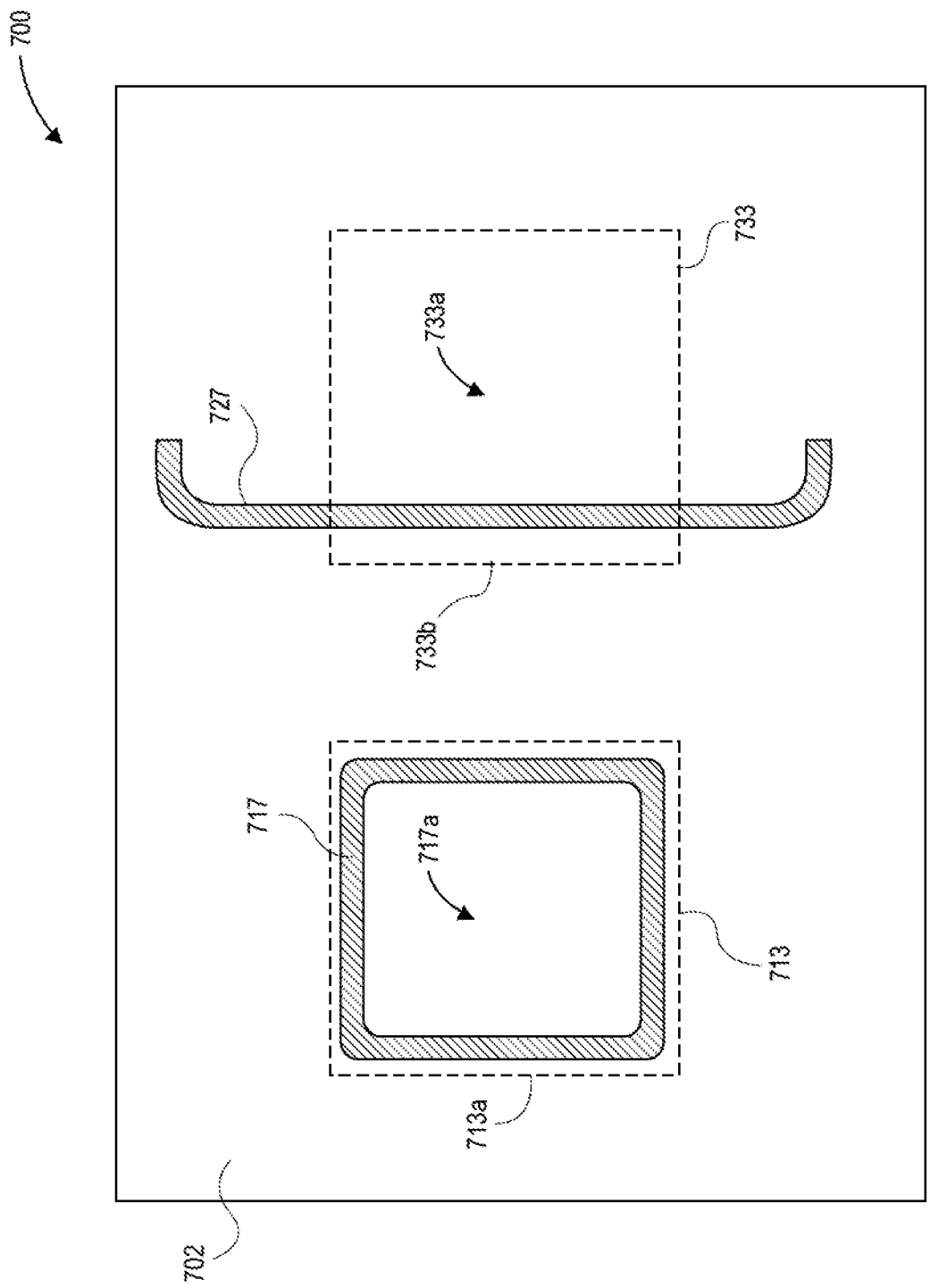
FIG. 7 is a top-down view of a substrate with two die shadows that show placement of a hydrophobic ablation barrier, in accordance with various embodiments.

FIG. 7 is a top-down view of a substrate with two die shadows that show placement of a hydrophobic ablation barrier, in accordance with various embodiments. Package 700 includes a substrate 702, which may be similar to substrate 302 of FIG. 3. Die shadows 713, 733 are shown on the substrate, with their respective dies not shown.

Ablation barrier 717 may be disposed upon substrate 702 within the die shadow 713. The ablation barrier 717 may be positioned to minimize a fillet, such as fillet 310 of FIG. 3, that may form at or near the edge 713a of shadow die 713. During epoxy flow, the epoxy, such as epoxy 308 of FIG. 3, may be flowed into an internal area 717a formed by a loop of the ablation barrier 717 on the substrate 702. When the epoxy encounters the ablation barrier 717, the epoxy may significantly slow or stop progress beyond the ablation barrier. In embodiments, the ablation barrier 717 may be formed using a laser to perform laser ablation. In embodiments, the ablation barrier 717 may be applied to the substrate 702 or a surface of the die, for example a surface of the die 304 of FIG. 3.

Ablation barrier 727 may be disposed upon substrate 702, and partially divide shadow area 733. As shown, epoxy may be deposited in region 733a, and flow toward shadow die edge 733b, where it will be slowed down by ablation barrier 727. As a result, there will be minimum to no epoxy fillet proximate to shadow die edge 733b when the die is coupled with the substrate 702.

Figure 8:
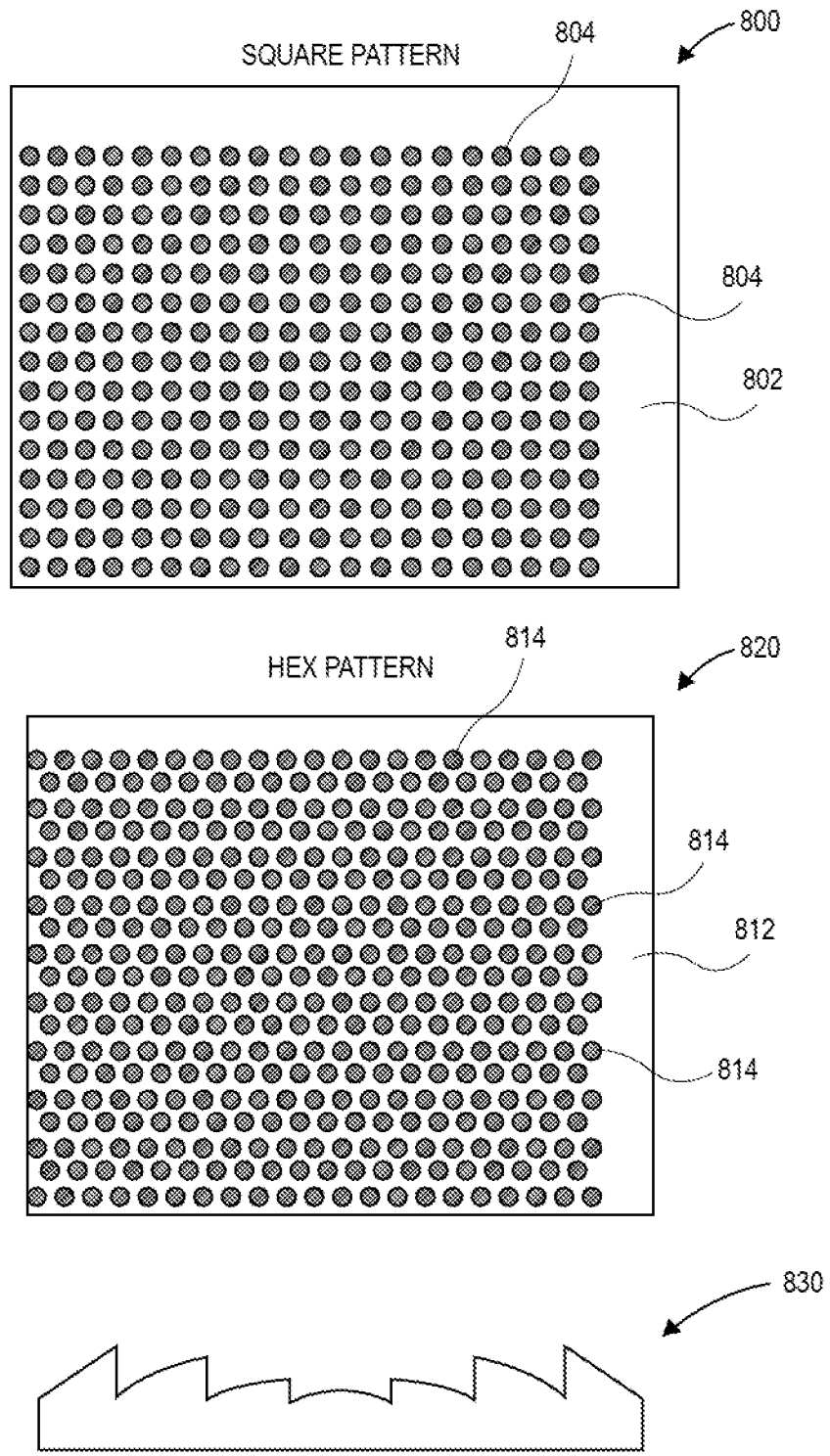
FIG. 8 shows example patterns for a hydrophobic ablation barrier, in accordance with various embodiments.

FIG. 8 shows example patterns for a hydrophobic ablation barrier, in accordance with various embodiments. In embodiments, there may be a number of different ablation barrier patterns that may be used to produce hydrophobic regions on either a substrate, such as substrate 702 of FIG. 7, or on a surface of a die, such as die 304 of FIG. 3. Some examples of hydrophobic ablation barrier patterns are described here. However, this is not a limiting set of ablation barrier patterns. Other patterns may be used in according to embodiments.

Hydrophobic ablation barrier pattern 800 shows a top-down view that may include a plurality of ablated holes 804 that form a square pattern grid on a surface 802. In embodiments, each hole 804 may be positioned within a particular row and a particular column. In embodiments, the surface 802 may be a surface of a substrate 702 of FIG. 7, or a surface of a die 304 of FIG. 3.

Hydrophobic ablation barrier pattern 820 shows a top-down view that may include a plurality of ablated holes 814 that form a hexagonal pattern grid on a surface 812. In embodiments, each hole 814 may be positioned along one or more diagonals. In embodiments, the surface 812 may be a surface of the substrate 702 of FIG. 7, or a surface of a die 304 of FIG. 3.

Hydrophobic ablation barrier pattern 830 shows a side view of a pattern that may be similar to a Fresnel lens pattern. In embodiments, pattern 830 may be etched into a surface of a substrate 702 of FIG. 7 or a surface of a die 304 of FIG. 3 in order to slow epoxy flow at or across the barrier pattern 830. In embodiments, portions of the design of the pattern 830 may be used, or may be repeated along the surface. The pattern 830, whether periodic or not, may create an energy balance between the epoxy on top of a structure and hanging between the structure. This energy balance slows down/abates epoxy flow resulting in hydrophobic tendencies. In embodiments, hydrophobic ablation barrier patterns 800, 820, 830 may include laser-induced periodic or repeating structures to create a resulting surface feature that does not promote epoxy flow.

Figure 9:
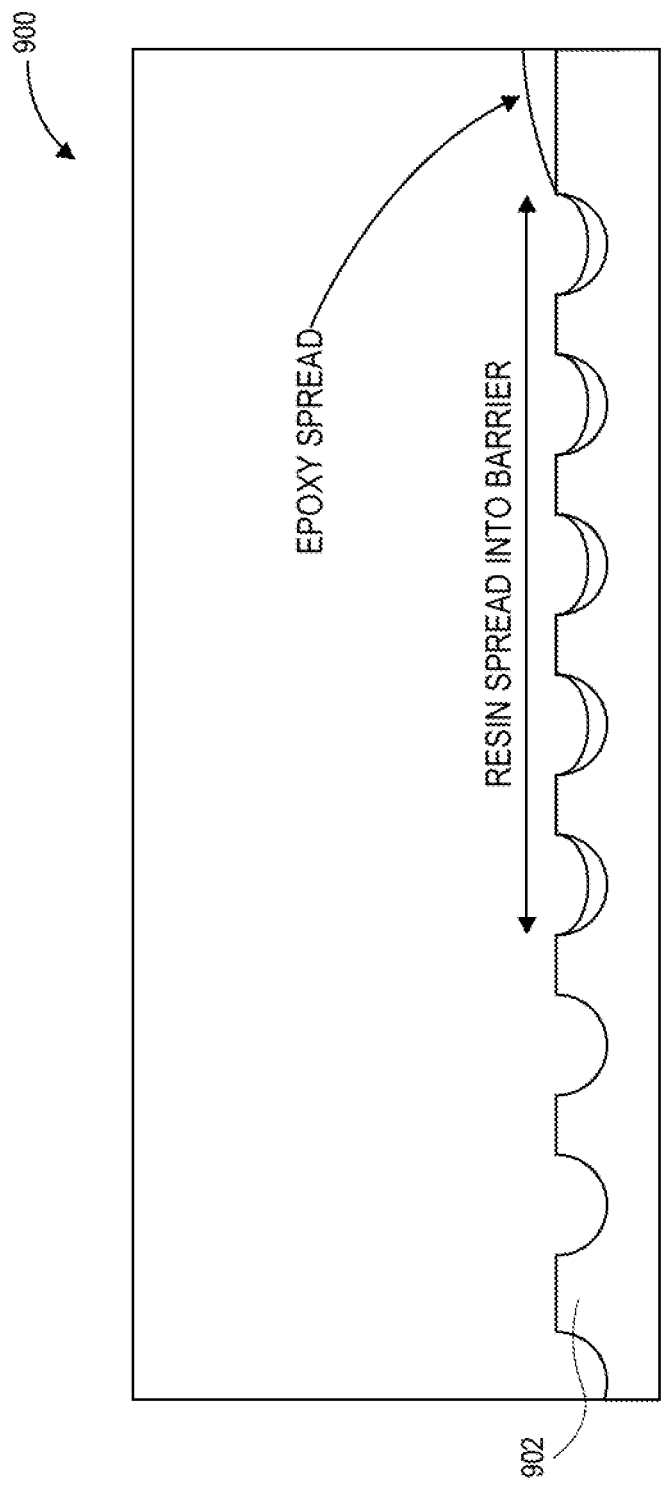
FIG. 9 shows a cross-section of an ablation barrier that includes a square pattern of holes, with various ranges of epoxy spread or resin spread, in accordance with various embodiments.

FIG. 9 shows a cross-section of an ablation barrier that includes a square pattern of holes, with various ranges of epoxy spread or resin spread, in accordance with various embodiments. Diagram 900 shows an example cross-section of a square pattern, such as hydrophobic ablation barrier pattern 800 of FIG. 8, that is etched into substrate 902, which may be similar to substrate 802 of FIG. 8. Ablated holes in the substrate 902 may be similar to ablated holes 804 of FIG. 8. As shown, different adhesives, such as epoxy or resin, may have different characteristics, and therefore behave differently when encountering the hydrophobic ablation barrier pattern. The example shown in diagram 900, shows where epoxy spread stops and the distance into the barrier that resin takes to stop. These distance could vary based on the pattern and material used.

Figure 10:
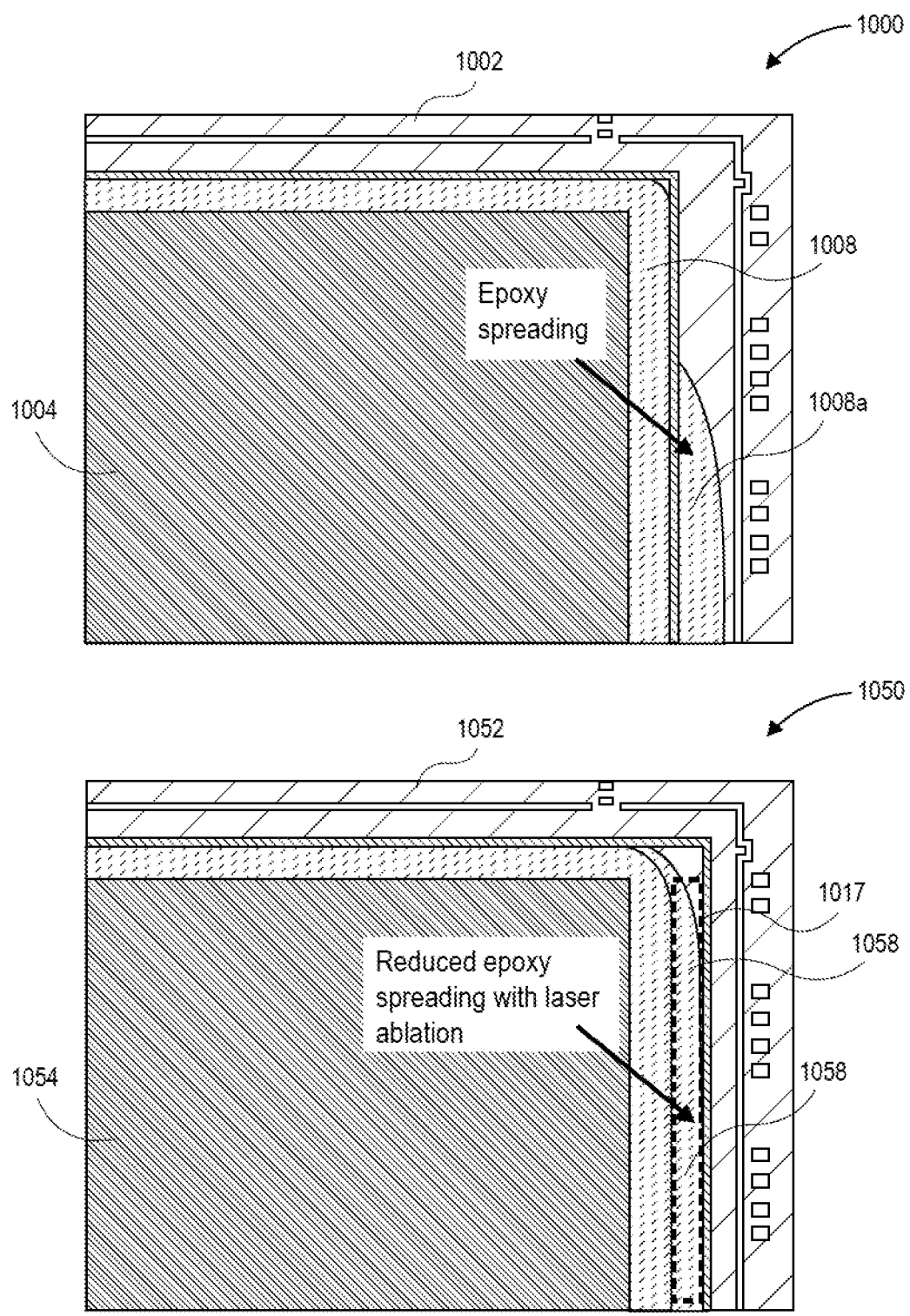
FIG. 10 shows example images of legacy epoxy spread versus reduced epoxy spread with laser ablation barriers, in accordance with various embodiments.

FIG. 10 shows example images of legacy epoxy spread versus reduced epoxy spread with laser ablation barriers, in accordance with various embodiments. Package 1000 shows a top-down view of a legacy package that does not use hydrophobic ablation barrier patterns. As shown, when epoxy 1008 is flowed between the die 1004 and the substrate 1002, epoxy bulges 1008a may be seen flowing far beyond the edge of the die 1004. These epoxy bulge areas 1008a may be forming epoxy fillets, for example epoxy fillets 112 of FIG. 1, that may make joining other dies to die 1004 difficult.

Package 1050 shows a top-down view of an embodiment of a package that uses hydrophobic ablation barrier patterns, in accordance with embodiments. As shown, when epoxy 1058 is flowed between the die 1054 and the substrate 1052, there are no epoxy bulges flowing beyond the edge of the die 1054. This is due to a laser ablation barrier 1017, which may be similar to a laser ablation barrier 717 of FIG. 7.

Figure 11:
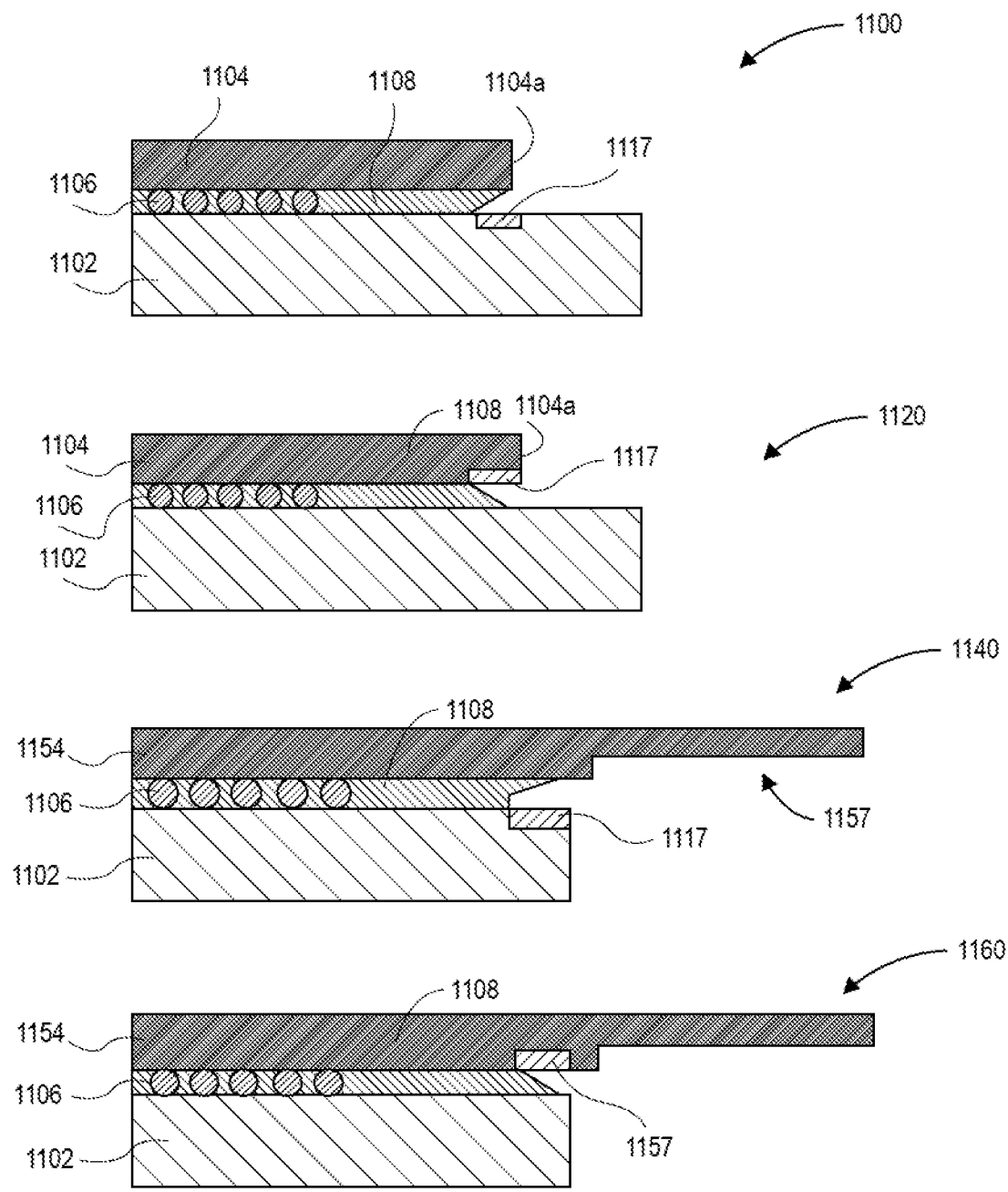
FIG. 11 illustrates various stages in a process for implementing a hydrophobic ablation barrier, in accordance with various embodiments.

FIG. 11 illustrates various stages in a process for implementing a hydrophobic ablation barrier, in accordance with various embodiments. Package 1100 shows die 1104 that is electrically and physically coupled with substrate 1102 using BGA 1106. In this embodiment, hydrophobic ablation barrier 1117 is placed on the substrate 1102 within the die shadow of die 1104. When epoxy 1108 is flowed, the hydrophobic ablation barrier 1117 slows the flow, so that the epoxy 1108 does not flow beyond the edge of the die 1104a. In this example, no epoxy fillet is formed. In embodiments, package 1100 may show a technique for a laser ablation barrier on a substrate 1102 for a top attach process.

Package 1120 shows another embodiment, with die 1104 that is electrically and physically coupled with substrate 1102 using BGA 1106. In this embodiment, hydrophobic ablation barrier 1117 is applied to a bottom surface of the die 1104. When epoxy 1108 is flowed hydrophobic ablation barrier 1117 blocks the epoxy flow so it does not extend beyond the edge of the die 1104a. In this example, no epoxy fillet is formed. As a result, for package 1100 and package 1120, a FAU, such as FAU 370 of FIG. 3, may be positioned directly on top and overhanging the die 1104, after the die 1104 has been etched, without being misaligned by an epoxy fillet, such as epoxy fillet 112 of FIG. 1. In embodiments, package 1120 may show a technique for a laser ablation barrier on a die 1104 for a top attach process.

Package 1140 shows another embodiment, with die 1154, which may be similar to die 154 of FIG. 1, that is electrically and physically coupled with substrate 1102 using BGA

1106. Hydrophobic ablation barrier 1117 is placed at the top of the substrate 1102, to block the flow of epoxy 1108 from flowing underneath the V-groove 1157 section of the die 1154. This way, optical fibers (not shown) that couple with the V-groove 1157 may cleanly optically couple with die 1154. In embodiments, package 1140 may show a laser ablation barrier on a substrate 1102 for a side attach process.

Package 1160 shows another embodiment, with die 1154 that is electrically and physically coupled with substrate 1102 using BGA 1106. hydrophobic ablation barrier 1117 is disposed at a bottom of the die 1154 to prevent or slow down epoxy 1108 from flowing underneath the V-groove area 1157. This way, optical fibers (not shown) that couple with the V-groove 1157 may cleanly optically couple with die 1154. In embodiments, package 1160 may show a laser ablation barrier on a die 1154 for a side attach process.

Figure 12:
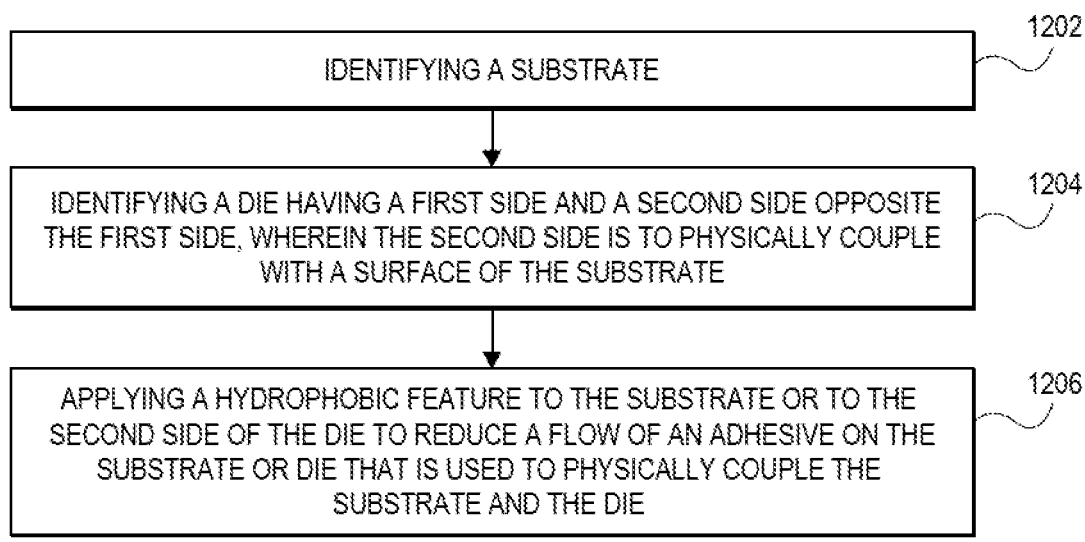
FIG. 12 is a process for implementing a hydrophobic barrier onto a package, in accordance with various embodiments.

FIG. 12 is a process for implementing a hydrophobic barrier onto a package, in accordance with various embodiments. Process 1200 may be implemented using apparatus, systems, techniques, or processes as described herein, and in particular with respect to FIGS. 1-11.

At block 1202, the process may include identifying a substrate. In embodiments, the substrate may be similar to substrate 302, 352 of FIG. 3, 402 of FIG. 4, 502 of FIG. 5, 602 of FIG. 6, 702 of FIG. 7, 802, 812 FIG. 8, 902 of FIG. 9, 1002, 1052 of FIG. 10, or 1102 of FIG. 11. The identification of the substrate is used to identify substrate to which a die may be subsequently attached using one or more embodiments described herein.

At block 1204, the process may further include identifying a die having a first side and a second side opposite the first side, wherein the second side is to physically couple with a surface of the substrate. In embodiments, the die may be similar to die 304, 354 of FIG. 3, 504 of FIG. 5, 604, 654 of FIG. 6, 1004, 1054 of FIG. 10 or 1104, 1154 of FIG. 11.

At block 1206, the process may further include applying a hydrophobic feature to the substrate or to the second side of the die to reduce a flow of an adhesive on the substrate or die that is used to physically couple the substrate and the die. In embodiments, the hydrophobic feature may include a hydrophobic chemical barrier that may be similar to hydrophobic chemical barrier 417, 427 of FIG. 4, 517 of FIG. 5, or 617 of FIG. 6. In embodiments, the hydrophobic feature may include a hydrophobic ablation barrier, in the form of a pattern, which may be similar to hydrophobic ablation barrier 717, 727 of FIG. 7, 800, 820 of FIG. 8, 917 of FIG. 9, 1017 of FIG. 10, or 1117 of FIG. 11.

Figure 13:
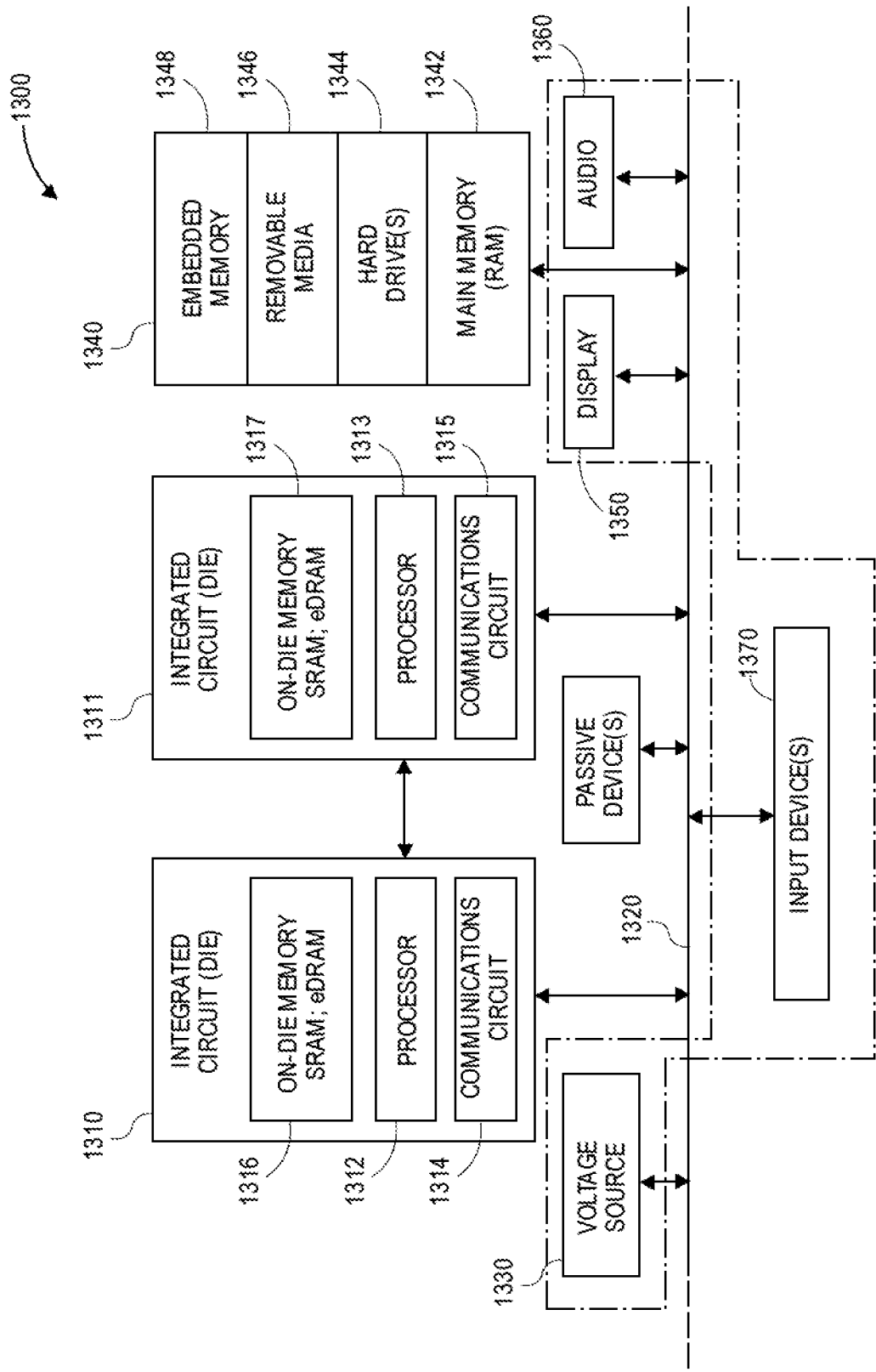
FIG. 13 is a schematic of a computer system, in accordance with an embodiment of the present invention.

FIG. 13 is a schematic of a computer system 1300, in accordance with an embodiment of the present invention. The computer system 1300 (also referred to as the electronic system 1300) as depicted can embody a hydrophobic feature to control adhesive flow, according to any of the several disclosed embodiments and their equivalents as set forth in this disclosure. The computer system 1300 may be a mobile device such as a netbook computer. The computer system 1300 may be a mobile device such as a wireless smart phone. The computer system 1300 may be a desktop computer. The computer system 1300 may be a hand-held reader. The computer system 1300 may be a server system. The computer system 1300 may be a supercomputer or high-performance computing system.

In an embodiment, the electronic system 1300 is a computer system that includes a system bus 1320 to electrically couple the various components of the electronic system 1300. The system bus 1320 is a single bus or any combination of busses according to various embodiments. The electronic system 1300 includes a voltage source 1330 that provides power to the integrated circuit 1310. In some embodiments, the voltage source 1330 supplies current to the integrated circuit 1310 through the system bus 1320.

The integrated circuit 1310 is electrically coupled to the system bus 1320 and includes any circuit, or combination of circuits according to an embodiment. In an embodiment, the integrated circuit 1310 includes a processor 1312 that can be of any type. As used herein, the processor 1312 may mean any type of circuit such as, but not limited to, a microprocessor, a microcontroller, a graphics processor, a digital signal processor, or another processor. In an embodiment, the processor 1312 includes, or is coupled with, a component that includes a hydrophobic feature to control adhesive flow, as disclosed herein. In an embodiment, SRAM embodiments are found in memory caches of the processor. Other types of circuits that can be included in the integrated circuit 1310 are a custom circuit or an application-specific integrated circuit (ASIC), such as a communications circuit 1314 for use in wireless devices such as cellular telephones, smart phones, pagers, portable computers, two-way radios, and similar electronic systems, or a communications circuit for servers. In an embodiment, the integrated circuit 1310 includes on-die memory 1316 such as static random-access memory (SRAM). In an embodiment, the integrated circuit 1310 includes embedded on-die memory 1316 such as embedded dynamic random-access memory (eDRAM).

In an embodiment, the integrated circuit 1310 is complemented with a subsequent integrated circuit 1311. Useful embodiments include a dual processor 1313 and a dual communications circuit 1315 and dual on-die memory 1317 such as SRAM. In an embodiment, the dual integrated circuit 1310 includes embedded on-die memory 1317 such as eDRAM.

In an embodiment, the electronic system 1300 also includes an external memory 1340 that in turn may include one or more memory elements suitable to the particular application, such as a main memory 1342 in the form of RAM, one or more hard drives 1344, and/or one or more drives that handle removable media 1346, such as diskettes, compact disks (CDs), digital variable disks (DVDs), flash memory drives, and other removable media known in the art. The external memory 1340 may also be embedded memory 1348 such as the first die in a die stack, according to an embodiment.

In an embodiment, the electronic system 1300 also includes a display device 1350, an audio output 1360. In an embodiment, the electronic system 1300 includes an input device such as a controller 1370 that may be a keyboard, mouse, trackball, game controller, microphone, voice-recognition device, or any other input device that inputs information into the electronic system 1300. In an embodiment, an input device 1370 is a camera. In an embodiment, an input device 1370 is a digital sound recorder. In an embodiment, an input device 1370 is a camera and a digital sound recorder.

As shown herein, the integrated circuit 1310 can be implemented in a number of different embodiments, including a package substrate having a hydrophobic feature to control adhesive flow, according to any of the several disclosed embodiments and their equivalents, an electronic system, a computer system, one or more methods of fabricating an integrated circuit, and one or more methods of fabricating an electronic assembly that includes a package substrate having a hydrophobic feature to control adhesive flow, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a hydrophobic feature to control adhesive flow embodiments and their equivalents. A foundation substrate may be included, as represented by the dashed line of FIG. 13. Passive devices may also be included, as is also depicted in FIG. 13.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a package comprising: a substrate; a die with a first side and a second side opposite the first side, the second side physically coupled with a surface of the substrate; and a hydrophobic feature coupled with the second side of the die or the surface of the substrate to reduce a flow of an adhesive on the substrate or the die.

Example 2 may include the package of example 1, wherein the adhesive is a selected one of: epoxy or resin.

Example 3 may include the package of example 1, wherein the hydrophobic feature is to reduce the flow of the adhesive when in contact with the hydrophobic feature.

Example 4 may include the package of example 1, wherein the hydrophobic feature is at least partially disposed within a die shadow area.

Example 5 may include the package of example 4, wherein the hydrophobic feature surrounds an area on the die or on an area on the surface of the substrate.

Example 6 may include the package of example 1, wherein the hydrophobic feature further includes a chemical barrier.

Example 7 may include the package of example 6, wherein the chemical barrier includes a material with a high thixotropic index.

Example 8 may include the package of example 6, wherein the chemical barrier is disposed next to a die edge.

Example 9 may include the package of example 6, wherein a width of the chemical barrier is less than 150 micrometers.

Example 10 may include the package of any one of examples 1-9, wherein the hydrophobic feature further includes a pattern barrier.

Example 11 may include the package of example 10, wherein the pattern barrier includes a plurality of holes.

Example 12 may include the package of example 11, wherein the plurality of holes are arranged in a selected one of: a square pattern or a hexagonal pattern.

Example 13 may include the package of example 10, wherein the pattern barrier is formed with laser ablation.

Example 14 is a method comprising: identifying a substrate; identifying a die having a first side and a second side opposite the first side, wherein the second side is to physically couple with a surface of the substrate; and applying a hydrophobic feature to the substrate or to the second side of the die to reduce a flow of an adhesive on the substrate or die that is used to physically couple the substrate and the die.

Example 15 may include the method of example 14, further comprising physically coupling the surface of the substrate with the second side of the die.

Example 16 may include the method of example 15, further comprising flowing the adhesive between the second side of the die and the surface of the substrate.

Example 17 may include the method of any one of examples 14-16, wherein the hydrophobic feature is a selected on of: epoxy or resin.

Example 18 is a package comprising: a substrate; a first die with a first side and a second side opposite the first side, the second side physically coupled with a surface of the substrate; and a hydrophobic feature coupled with the second side of the first die or the surface of the substrate to reduce a flow of an adhesive on the substrate or on the first die; a second die with a first side and a second side opposite the first side, the second side of the second die physically coupled with the first side of the first die; and wherein a fillet formed subsequent to a flow of the adhesive adjacent at an edge surface of the first die perpendicular to the first side of the first die is not in physical contact with the second die coupled with the first die.

Example 19 may include the package of example 18, where in the first side of the first die is etched after the flow of the adhesive and prior to physical coupling of the second side of the second die to the first die.

Example 20 may include the package of any one of examples 18-19, wherein the second die is a fiber attached unit (FAU) die.

What is claimed is:

1. A package comprising:
   a substrate;
   a die with a first side and a second side opposite the first side, the second side physically coupled with a surface of the substrate; and
   a hydrophobic feature on the the surface of the substrate to reduce a flow of an adhesive on the substrate, wherein the hydrophobic feature is at least partially within a die shadow area of the die.

2. The package of claim 1, wherein the adhesive is a selected one of: epoxy or resin.

3. The package of claim 1, wherein the hydrophobic feature is to reduce the flow of the adhesive when in contact with the hydrophobic feature.

4. The package of claim 1, wherein the hydrophobic feature surrounds an area on the die or on an area on the surface of the substrate.

5. The package of claim 1, wherein the hydrophobic feature further includes a chemical barrier.

6. The package of claim 4, wherein the chemical barrier includes a material with a high thixotropic index.

7. The package of claim 4, wherein the chemical barrier is disposed next to a die edge.

8. The package of claim 4, wherein a width of the chemical barrier is less than 150 micrometers.

9. The package of claim 1, wherein the hydrophobic feature further includes a pattern barrier.

10. The package of claim 9, wherein the pattern barrier includes a plurality of holes.

11. The package claim 10, wherein the plurality of holes are arranged in a selected one of: a square pattern or a hexagonal pattern.

12. The package of claim 9, wherein the pattern barrier is formed with laser ablation.

13. A method comprising:
    identifying a substrate;
    identifying a die having a first side and a second side opposite the first side, wherein the second side is to physically couple with a surface of the substrate; and
    applying a hydrophobic feature to the substrate to reduce a flow of an adhesive on the substrate that is used to physically couple the substrate and the die, wherein the hydrophobic feature is at least partially within a die shadow area of the die.

14. The method of claim 13, further comprising physically coupling the surface of the substrate with the second side of the die.

15. The method of claim 14, further comprising flowing the adhesive between the second side of the die and the surface of the substrate.

16. The method of claim 13, wherein the hydrophobic feature is a selected on of: epoxy or resin.

17. A package comprising:
    a substrate;
    a first die with a first side and a second side opposite the first side, the second side physically coupled with a surface of the substrate;
    a hydrophobic feature on the surface of the substrate to reduce a flow of an adhesive on the substrate, wherein the hydrophobic feature is at least partially within a die shadow area of the first die;
    a second die with a first side and a second side opposite the first side, the second side of the second die physically coupled with the first side of the first die; and
    wherein a fillet formed subsequent to a flow of the adhesive adjacent at an edge surface of the first die perpendicular to the first side of the first die is not in physical contact with the second die coupled with the first die.

18. The package of 18, where in the first side of the first die is etched after the flow of the adhesive and prior to physical coupling of the second side of the second die to the first die.

19. The package of claim 17, wherein the second die is a fiber attached unit (FAU) die.

* * * * *